(12) United States Patent
Peng et al.

(10) Patent No.: US 9,842,867 B2
(45) Date of Patent: Dec. 12, 2017

(54) ARRAY SUBSTRATE AND METHOD OF MANUFACTURING THE SAME, AND DISPLAY PANEL

(71) Applicants: BOE Technology Group Co., Ltd., Beijing (CN); Hefei Xinsheng Optoelectronics Technology Co., Ltd., Anhui (CN)

(72) Inventors: Junlin Peng, Beijing (CN); Shuai Yuan, Beijing (CN); Ming Huang, Beijing (CN); Lilu Zhao, Beijing (CN); Feng Xu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/140,723

(22) Filed: Apr. 28, 2016

(65) Prior Publication Data
US 2017/0092665 A1    Mar. 30, 2017

(30) Foreign Application Priority Data
Sep. 24, 2015    (CN) .......................... 2015 1 0617952

(51) Int. Cl.
*H01L 27/12* (2006.01)
*H01L 21/308* (2006.01)
*H01L 29/417* (2006.01)

(52) U.S. Cl.
CPC ...... *H01L 27/1288* (2013.01); *H01L 21/3085* (2013.01); *H01L 27/124* (2013.01); *H01L 29/41733* (2013.01)

(58) Field of Classification Search
CPC ........... H01L 27/1262; H01L 29/41733; H01L 29/4908; H01L 27/3262; H01L 29/42384;
(Continued)

(56) References Cited

U.S. PATENT DOCUMENTS

| 9,252,166 B2 | 2/2016 | Li et al. |
| 2016/0141424 A1* | 5/2016 | Meng ................ H01L 29/41733 257/43 |
| 2016/0190163 A1 | 6/2016 | Luo et al. |

FOREIGN PATENT DOCUMENTS

| CN | 103715207 A | 4/2014 |
| CN | 104392920 A | 3/2015 |

(Continued)

OTHER PUBLICATIONS

First Office Action from Chinese Patent Application No. 201510617952.2, dated Jul. 17, 2017, 13 pages.
(Continued)

*Primary Examiner* — Roy Potter
(74) *Attorney, Agent, or Firm* — Westman, Champlin & Koehler, P.A.

(57) ABSTRACT

The present disclosure provides an array substrate and a method of manufacturing the same, and a display panel comprising the array substrate, for reducing a drop or height difference between surfaces of portions of a passivation layer located on either side of a source/drain electrode lead wire and a surface of a portion of passivation layer located on an upper surface of the source/drain electrode lead wire so as to increase an aperture ratio of the display panel. The method comprises: forming a source/drain electrode lead wire and a passivation layer successively on a base substrate, the passivation layer at least covering the source/drain electrode lead wire; and thinning a portion of the passivation layer located on the source/drain electrode lead wire such that a surface of the portion is higher than those of other
(Continued)

portions of the passivation layer, at the time of patterning the passivation layer to form a via hole therein.

16 Claims, 5 Drawing Sheets

(58) Field of Classification Search
 CPC .............. H01L 27/1288; H01L 27/124; H01L 21/3085; H01L 27/1259; H01L 27/127; H01L 21/77; H01L 29/78633
 See application file for complete search history.

(56) References Cited

FOREIGN PATENT DOCUMENTS

| | | |
|---|---|---|
| CN | 104614910 A | 5/2015 |
| WO | 2014166168 A1 | 10/2014 |

OTHER PUBLICATIONS

Second Office Action from Chinese Patent Application No. 201510617952.2, dated Sep. 22, 2017, 11 pages.

\* cited by examiner

Fig. 1

```
                                                                    ┌─ S101
┌──────────────────────────────────────────────────────────────┐   /
│  forming a source/drain electrode lead wire and a passivation│ /
│   layer in turn on a base substrate, the passivation layer   │
│     covering at least the source/drain electrode lead wire   │
└──────────────────────────────────────────────────────────────┘
                               │
                               ▼
┌──────────────────────────────────────────────────────────────┐   ┌─ S102
│     thinning a portion of the passivation layer located on the│ /
│  source/drain electrode lead wire such that a surface of the │/
│  portion is higher than those of other portions of the       │
│  passivation layer, at the time of patterning the passivation│
│  layer to form a via hole therein                            │
└──────────────────────────────────────────────────────────────┘
```

ARRAY SUBSTRATE AND METHOD OF MANUFACTURING THE SAME, AND DISPLAY PANEL

CROSS-REFERENCE TO RELATED APPLICATION

This application claims the benefit of the Chinese Patent Application No. 201510617952.2 filed on Sep. 24, 2015 in the State Intellectual Property Office of China, the whole disclosure of which is incorporated herein by reference.

BACKGROUND OF THE INVENTION

Field of the Invention

Embodiments of the present disclosure generally relate to the field of display technologies, and particularly, to an array substrate and a method of manufacturing the same, and a display panel.

Description of the Related Art

ADS (Advanced Super Dimension Switch) technology is a wide viewing angle display technology, and HADS technology is an ADS-based technology developed for a mobile product.

Figure 1:
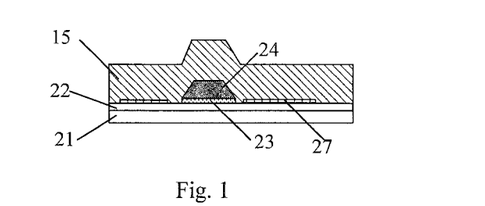
FIG. 1 is a structural schematic diagram showing an array substrate in prior arts.

HADS technology is developed for a mobile product, which generally requires a higher aperture ratio. Referring to FIG. 1, in general, an array substrate of a display panel comprises a gate insulation layer 22, an active layer 23, source/drain electrode lead wire 24, a passivation layer 15, and a first transparent conductive layer 27 arranged in the same layer as the source/drain electrode lead wire 24, which are formed on a base substrate 21, wherein the active layer 23 comprises amorphous silicon (a-Si), and the source/drain electrode lead wire 24 (S/D) is manufactured by using a half-tone mask process, Further, a thickness of the active layer 23 under the S/D is generally about 2000 angstroms. With addition of the thickness of the source/drain electrode lead wire 24, a surface of a region where the passivation layer 15 and the source/drain electrode lead wire are located is higher than surfaces of other regions by 5950 angstroms. During rubbing, a rubbing effect at a side of the source/drain electrode layer opposite to a direction of the rubbing action is weaker, which adversely affects deflection of liquid crystal molecules and thereby results in light leakage. Currently, it is required to increase a size of a light shielding region BM to reduce or avoid light leakage, which will accordingly reduce the aperture ratio of the display panel.

Thus, in prior arts, drop between an upper surface of the source/drain electrode lead wire and surfaces on both sides of the source/drain electrode lead wire will be larger after processes of manufacturing the array substrate are completed, which renders rubbing effect at a side of the source/drain electrode layer opposite to a direction of the rubbing action to be weaker, and thus results in light leakage phenomenon; although the light leakage phenomenon may be avoided by increasing the width of BM, the aperture ratio of the display panel will be reduced.

SUMMARY

Embodiments of the present disclosure provide an array substrate and a method of manufacturing the same, and a display panel comprising the array substrate, for reducing a drop or height difference between surfaces of portions of a passivation layer located on either side of a source/drain electrode lead wire and a surface of a portion of passivation layer located on an upper surface of the source/drain electrode lead wire so as to increase an aperture ratio of the display panel.

According to an aspect of the present disclosure, there is provided a method of manufacturing an array substrate, comprising steps of:

forming a source/drain electrode lead wire and a passivation layer successively on a base substrate, the passivation layer covering at least the source/drain electrode lead wire; and thinning a portion of the passivation layer located on the source/drain electrode lead wire such that a surface of the portion is higher than those of other portions of the passivation layer, at the time of patterning the passivation layer to form a via hole therein.

According to the method of manufacturing an array substrate provided in embodiments of the present disclosure, the source/drain electrode lead wire and the passivation layer are firstly formed on the base substrate successively, then a portion of the passivation layer located on the source/drain electrode lead wire is thinned such that the portion or region of the passivation layer corresponding to the source/drain electrode lead wire is higher than other portions or regions of the passivation layer, while the passivation layer is patterned to form a via hole therein. Thus, the thicknesses of portions of the passivation layer located on either side of the source/drain electrode lead wire are larger than that of the portion of the passivation layer located on an upper surface of the source/drain electrode lead wire, such that a drop or height difference between surfaces of the portions of the passivation layer located on either side of the source/drain electrode lead wire and a surface of the portion of passivation layer located on the upper surface of the source/drain electrode lead wire is reduced, thereby, a rubbing effect at a side of the source/drain electrode layer opposite to a direction of the rubbing action is improved, and the light leakage phenomenon is avoided without increasing width of BM for preventing light leakage, increasing the aperture ratio of the display panel.

Preferably, patterning the passivation layer to form a via hole therein, while thinning a portion of the passivation layer located on the source/drain electrode lead wire such that a surface of the portion is higher than those of other portions of the passivation layer comprises:

forming a photoresist layer on the passivation layer;

exposing and developing the photoresist layer with a mask so as to form a photoresist partially-remained region, a photoresist fully-removed region and a photoresist fully-remained region, the photoresist partially-remained region corresponding to the source/drain electrode lead wire, the photoresist fully-removed region corresponding to a region of the passivation layer where the via hole is to be formed;

thinning a portion of the passivation layer corresponding to the photoresist fully-removed region;

removing photoresist from the photoresist partially-remained region; and thinning a portion of the passivation layer corresponding to the photoresist partially-remained region, while fully removing the portion of the passivation layer corresponding to the photoresist fully-removed region to form the via hole.

The passivation layer is patterned to form a via hole therein while the portion of the passivation layer located on the source/drain electrode lead wire is thinned, such that the light leakage phenomenon of the array substrate can be avoided without adding any other process, and process steps are simplified.

Preferably, thinning a portion of the passivation layer corresponding to the photoresist fully-removed region comprises etching the portion of the passivation layer corresponding to the photoresist fully-removed region.

Preferably, a thickness of the etched portion of the passivation layer corresponding to the photoresist fully-removed region is ¼~⅓ of those of other portions of the passivation layer.

In order to prevent the surface of the region or portion of the passivation layer corresponding to the source/drain electrode lead wire from being lower than that of the other regions or portions of the passivation layer, it is preferable that the thickness of the region or portion of the passivation layer corresponding to the source/drain electrode lead wire may be reduced to ⅔~¾ of that of the other regions or portions of the passivation layer. Thus, a portion of the passivation layer, which is located in the region corresponding to the via hole and will be firstly etched off, has a thickness being ⅔~¾ of the thickness of the other regions or portions of the passivation layer.

Preferably, thinning a portion of the passivation layer corresponding to the photoresist partially-remained region comprises etching the portion of the passivation layer corresponding to the photoresist partially-remained region.

Preferably, the method further comprises stripping the photoresist from the photoresist fully-remained region.

Preferably, the mask the mask is a half tone mask, a gray tone mask or a mask having slits.

According to another aspect of the present disclosure, there is further provided an array substrate manufactured by using the above method of the present disclosure, the array substrate comprising the source/drain electrode lead wire and the passivation layer formed successively on the base substrate, the passivation layer covering at least the source/drain electrode lead wire, a surface of a portion of the passivation layer located on the source/drain electrode lead wire being higher than those of other portions of the passivation layer, and a thickness of the portion of the passivation layer located on the source/drain electrode lead wire being smaller than those of the other portions of the passivation layer Preferably, the thickness of the thinned portion of the passivation layer located on the source/drain electrode lead wire is ⅔~¾ of those of the other portions of the passivation layer.

According to a further aspect of the present disclosure, there is provided a display panel, comprising the array substrate provided according to embodiments of the present disclosure.

DETAILED DESCRIPTION OF THE EMBODIMENTS

In order to make clearer understanding of the above objects, features and advantages of the present disclosure, the present invention will be described hereinafter in detail with reference to exemplary embodiments and attached drawings. Obviously, the described embodiments are only some, rather than all, of embodiments of the present disclosure. Based on the embodiments of the present disclosure, all of other embodiments obtained by those skilled in the art without any creative work will fall within the scope of the present invention.

In the drawings, thicknesses, sizes and shapes of various layers of films and regions do not reflect actual scale of parts of an array substrate, but are only intended to illustrate contents of the present disclosure.

Embodiments of the present disclosure provide an array substrate and a method of manufacturing the same, and a display panel comprising the array substrate, which are intended to reduce a drop or height difference between surfaces of portions of a passivation layer located on either side of a source/drain electrode lead wire and a surface of a portion of passivation layer located on an upper surface of the source/drain electrode lead wire so as to increase an aperture ratio of the display panel.

Figure 2:
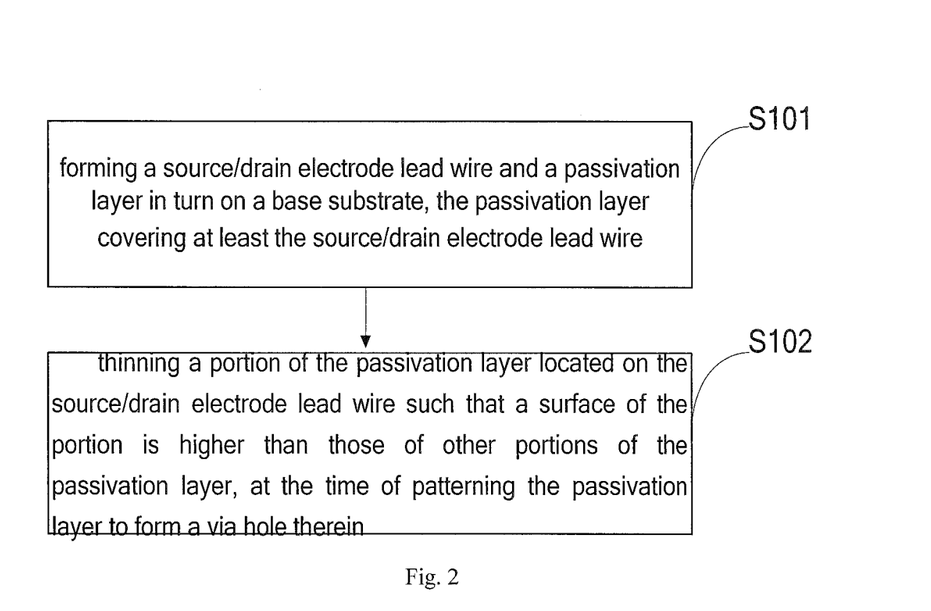
FIG. 2 is a flowchart of a method of manufacturing an array substrate according to an exemplary embodiment of the present disclosure.
Figure 3:
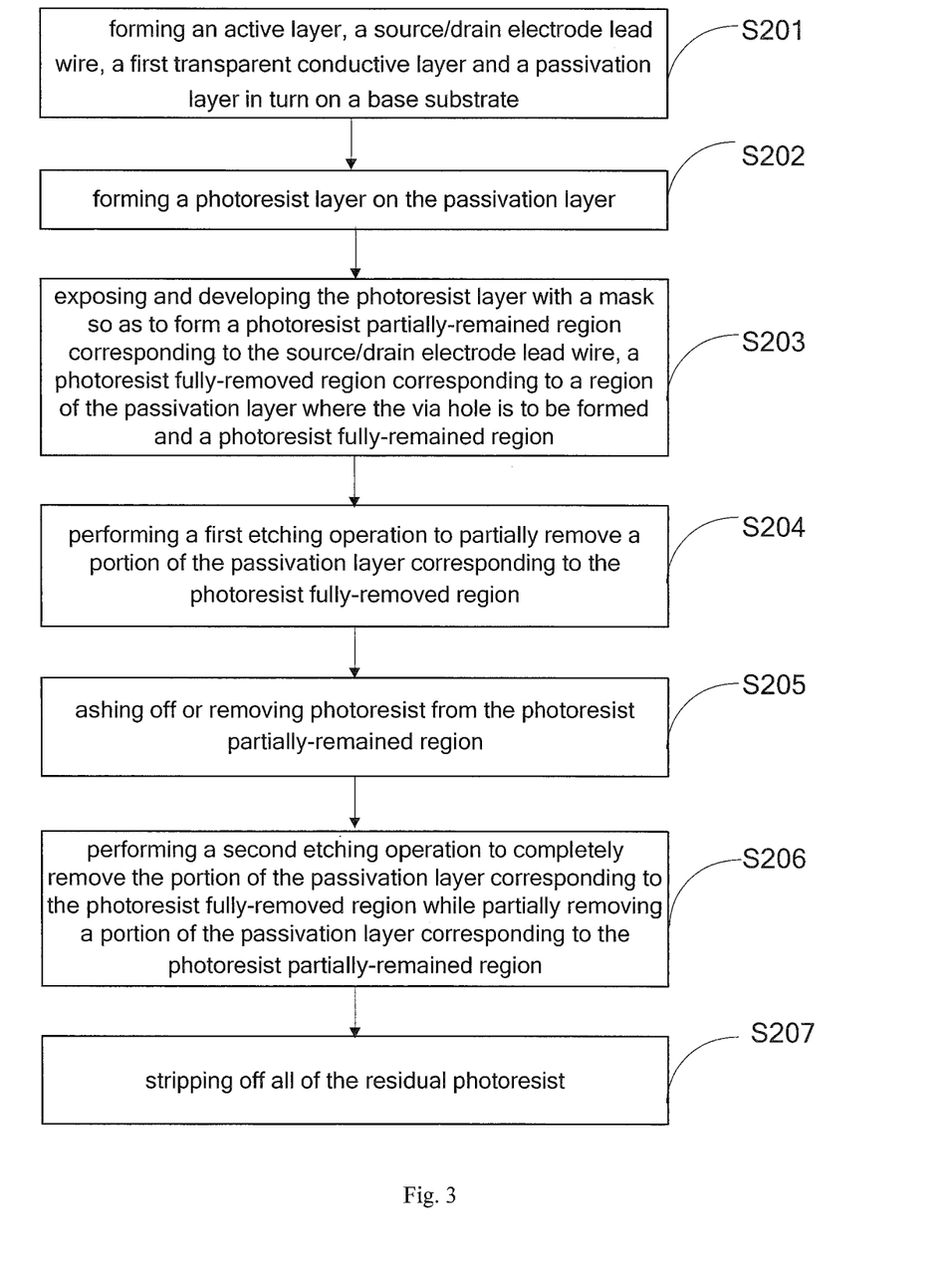
FIG. 3 is a flowchart of a method of manufacturing an array substrate according to another exemplary embodiment of the present disclosure.

An exemplary embodiment of the present disclosure provides a method of manufacturing an array substrate, as shown in FIG. 2, the method comprising following steps:

At step S101, a source/drain electrode lead wire and a passivation layer at least covering the source/drain electrode lead wire are formed in turn on a base substrate.

It is noted that, before forming the source/drain electrode lead wire on the base substrate, a gate insulation layer, an active layer, and a first transparent conductive layer may be also formed successively on the base substrate, and the first transparent conductive layer may be located in the same layer as the source/drain electrode lead wire. The source/drain electrode lead wire is located on the active layer.

At step S102, the passivation layer is patterned to form a via hole therein, while a region or portion of the passivation layer corresponding to the source/drain electrode lead wire (that is, a portion of the passivation layer located on the source/drain electrode lead wire) is thinned such that a surface of the thinned region or portion of the passivation layer is higher than those of other portions of the passivation layer.

It is noted that the via hole mentioned in embodiments the present disclosure is a via hole located at an end of the source/drain electrode lead wire of the display panel and configured for connection between the source/drain electrode lead wire and an external electrical signal. The region or portion of the passivation layer corresponding to the source/drain electrode lead wire is thinned such that the surface of the thinned region or portion of the passivation layer corresponding to the source/drain electrode lead wire should not be lower than that of other regions of the passivation layer. Thus, when thinning the passivation layer, it is necessary to prevent the thinned passivation layer from being too thin to function properly. Processes for thinning the passivation layer are not particularly limited in the present disclosure.

According to the method of manufacturing an array substrate provided in embodiments of the present disclosure, the source/drain electrode lead wire and the passivation layer are firstly formed on the base substrate in turn, then the passivation layer is patterned to form a via hole therein while a portion of the passivation layer located on or corresponding to the source/drain electrode lead wire is thinned such that the thinned portion or region of the passivation layer corresponding to the source/drain electrode lead wire is higher than other portions or regions of the passivation layer. Thus, the thickness of the portion or region of the passivation layer corresponding to the source/drain electrode lead wire will be smaller than thicknesses of other portions or regions of the passivation layer, that is, thicknesses of portions of the passivation layer located on either side of the source/drain electrode lead wire be larger than that of the portion of the passivation layer located on an upper surface of the source/drain electrode lead wire the, such that a drop or height difference between surfaces of the portions of the passivation layer located on either side of the source/drain electrode lead wire and a surface of the portion of passivation layer located on the upper surface of the source/drain electrode lead wire is reduced, thereby, a rubbing effect at a side of the source/drain electrode layer opposite to a direction of the rubbing action is improved, and thus the light leakage phenomenon is avoided without increasing the width of black matrix (BM) for preventing light leakage, thereby increasing the aperture ratio of the display panel.

Preferably, the above step S102 may include:

forming a photoresist layer on the passivation layer;

exposing and developing the photoresist layer by using a mask so as to form a photoresist partially-remained region, a photoresist fully-removed region and a photoresist fully-remained region, the photoresist partially-remained region corresponding to a region where the source/drain electrode lead wire is located (that is, corresponding to the region or portion of the passivation layer which is located on the source/drain electrode lead wire, or being located on the portion), the photoresist fully-removed region corresponding to a region or portion of the passivation layer where the via hole is to be formed;

thinning a portion or region of the passivation layer corresponding to the photoresist fully-removed region;

removing photoresist from the photoresist partially-remained region; and thinning a portion or region of the passivation layer corresponding to the photoresist partially-remained region, and meanwhile fully removing the portion or region of the passivation layer corresponding to the photoresist fully-removed region to form the via hole.

It is noted that, the photoresist partially-remained region corresponds to a region which is located on or corresponds to the upper surface of the source/drain electrode lead wire, the photoresist fully-removed region corresponds to a region where the via hole is to be formed at an end of the source/drain electrode lead wire, and the photoresist fully-remained region correspond to other regions than the regions where the via hole to be formed and the source/drain electrode lead wire are located. In addition, processes for thinning the passivation layer are not particularly limited in the present disclosure.

Particularly, in embodiments of the present disclosure, the region or portion of the passivation layer corresponding to the source/drain electrode lead wire is thinned while forming the via hole in the passivation layer, without increasing number of mask, such that the light leakage phenomenon can be avoided without adding any other process, and process steps may be simplified.

Preferably, the step of thinning the portion or region of the passivation layer corresponding to the photoresist fully-removed region may comprise:

etching the portion or region of the passivation layer corresponding to the photoresist fully-removed region.

It is noted that, the portion or region of the passivation layer corresponding to the photoresist fully-removed region may be etched by a dry or wet etching process, or by other process, which is not particularly limited in the present disclosure.

Preferably, a thickness of the etched portion or region of the passivation layer corresponding to the photoresist fully-removed region is $1/4 \sim 1/3$ of those of other portions or regions of the passivation layer.

Particularly, in embodiments of the present disclosure, two etching operations are needed to be performed to the region of the passivation layer where the via hole is to be formed to form the via hole, in which thinning process may be obtained during etching the portion or region of the passivation layer corresponding to the photoresist fully-removed region. Particularly, the first etching operation is performed to the region or portion of the passivation layer where the via hole is to be formed, and the second etching operation is performed to the portion or region of the passivation layer corresponding to the photoresist fully-removed region, during which the region or portion of the passivation layer corresponding to the source/drain electrode lead wire may also be etched. In embodiments of the present disclosure, preferably, the thickness of the region or portion of the passivation layer corresponding to the source/drain electrode lead wire may be reduced to $2/3 \sim 3/4$ of that of the other regions or portions of the passivation layer, such that the thickness of the region or portion of the passivation layer corresponding to the source/drain electrode lead wire is smaller that of the other regions or portions of the passivation layer while avoiding that the surface of the portion of the passivation layer corresponding to the source/ drain electrode lead wire may be lower than that of the other regions or portions of the passivation layer. Thus, during thinning the region or portion of the passivation layer corresponding to the source/drain electrode lead wire, a thickness of the portion to be removed or be thinned is ¼~⅓ of the thickness (that is, an initial thickness) of the other regions or portions of the passivation layer (that is, the region or portion of the passivation layer corresponding to the photoresist fully-remained region). Similarly, ¼~⅓ of the thickness of the other regions or portions of the passivation layer will be also etched off when the second etching operation is performed to the portion or region of the passivation layer where the via hole is to be formed. Thus, after the first etching operation, the thickness of the region or portion of the passivation layer corresponding to the via hole is ¼~⅓ of that of the other regions or portions of the passivation layer.

It is noted that only in a preferred embodiment, the thickness of the region or portion of the passivation layer corresponding to the photoresist fully-removed region is ¼~⅓ of that of the other regions or portions of the passivation layer after the first etching operation is performed, but the present disclosure is not limited to this.

Preferably, the step of thinning a portion or region of the passivation layer corresponding to the photoresist partially-remained region comprises:

etching the portion or region of the passivation layer corresponding to the photoresist partially-remained region.

It is noted that, the portion or region of the passivation layer corresponding to the photoresist partially-remained region may be etched by a dry or wet etching process, or by other process, which is not particularly limited in the present disclosure.

Preferably, the method of manufacturing an array substrate according to embodiments of the present disclosure may further comprise:

stripping off the photoresist from the photoresist fully-remained region.

Preferably, the mask, which is used for exposing and developing the photoresist layer so as to form the photoresist partially-remained region, the photoresist fully-removed region and the photoresist fully-remained region, may be a half tone mask, a gray tone mask or a mask having slits, and will not be particularly limited in the present disclosure.

Figure 4:
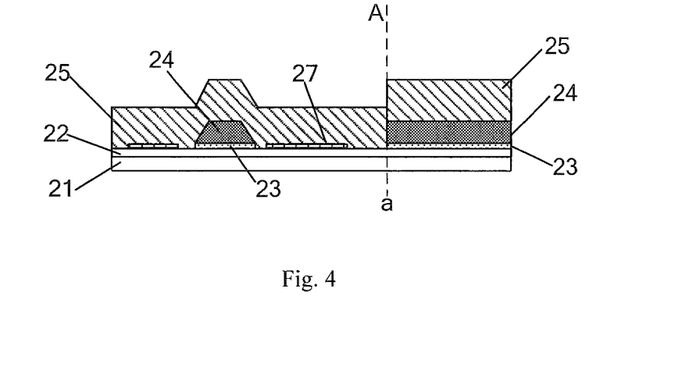
FIG. 4 is a structural schematic diagram showing the array substrate after performing a step S201 of the method shown in FIG. 3 according to an embodiment of the present disclosure.
Figure 5:
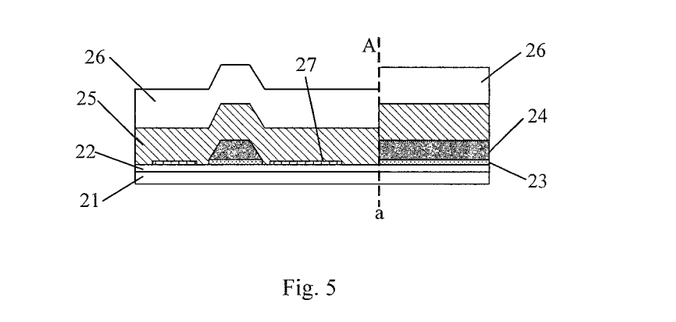
FIG. 5 is a structural schematic diagram showing the array substrate after performing a step S202 of the method shown in FIG. 3 according to an embodiment of the present disclosure.

In the following, an example of a method of manufacturing an array substrate according to embodiments of the present disclosure will be described in detail. With reference to FIGS. 3 to 12, the method includes following steps:

At step S201, a gate insulation layer 22, an active layer 23 located on the gate insulation layer 22, a source/drain electrode lead wire 24 located on the active layer 23, a first transparent conductive layer 27 and a passivation layer 25 are formed on a base substrate 21, the passivation layer 25 covering the gate insulation layer 22, the active layer 23, the source/drain electrode lead wire 24 and the first transparent conductive layer 27, as shown in FIG. 4. In FIG. 4, a sectional schematic diagram, which is taken from a side view of a source/drain electrode lead wire, is shown at left side of a division line A-a, while, a sectional schematic diagram, which is taken from a front view of a region where an end of the source/drain electrode lead wire is located, is shown at right side of the division line A-a;

Generally, the active layer 23 has a thickness of about 2000 angstroms, the passivation layer 25 has a thickness of about 6000 angstroms, and the source/drain electrode lead wire has a thickness of about 3950 angstroms. In this instance, a surface of a region or portion of the passivation layer 15 corresponding to the source/drain electrode lead wire 24 is higher than surfaces of other regions or portions of the passivation layer 25 by 5950 angstroms;

At step S202, a photoresist layer 26 is formed on the passivation layer 25, as shown in FIG. 5.

Figure 6:
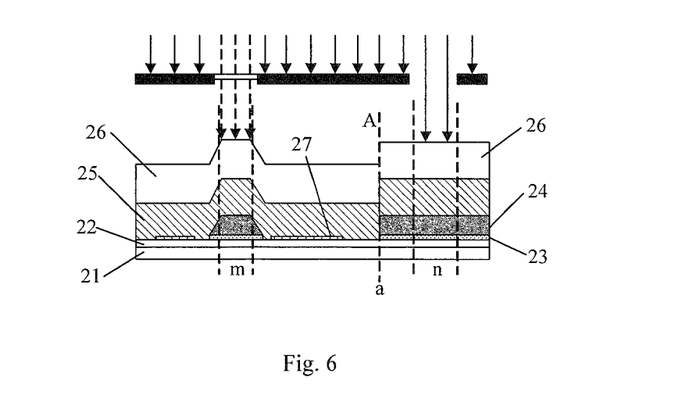
FIG. 6 is a structural schematic diagram showing the array substrate when performing a step S203 of the method shown in FIG. 3 according to an embodiment of the present disclosure.
Figure 7:
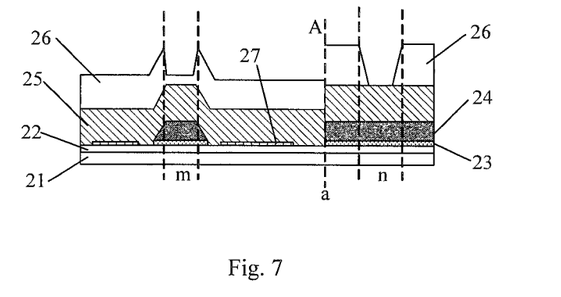
FIG. 7 is a structural schematic diagram showing the array substrate after performing the step S203 of the method shown in FIG. 3 according to an embodiment of the present disclosure.
Figure 8:
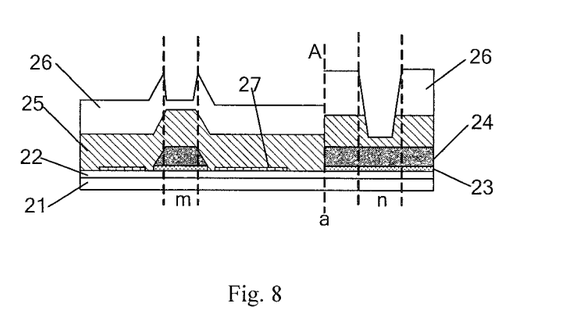
FIG. 8 is a structural schematic diagram showing the array substrate after performing a step S204 of the method shown in FIG. 3 according to an embodiment of the present disclosure.
Figure 9:
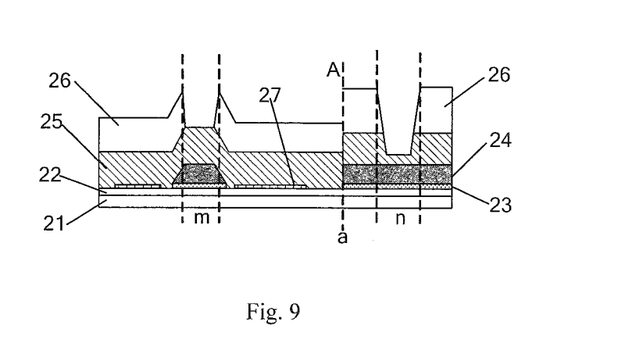
FIG. 9 is a structural schematic diagram showing the array substrate after performing a step S205 of the method shown in FIG. 3 according to an embodiment of the present disclosure.
Figure 10:
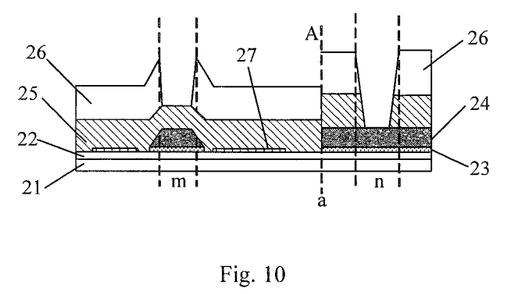
FIG. 10 is a structural schematic diagram showing the array substrate after performing a step S206 of the method shown in FIG. 3 according to an embodiment of the present disclosure.

At step S203, the photoresist layer 26 is exposed and developed by using a mask, where half-exposure is performed in m region of the photoresist layer 26, full-exposure is performed in n region of the photoresist layer 26, and other regions of the photoresist 26 are shielded from being exposed to light, as shown in FIG. 6; after having been exposed as shown in FIG. 6 and developed the exposed photoresist layer 26, a pattern as shown in FIG. 7 is obtained, where the m region is a region where the photoresist is partially remained, the n region is a region where the photoresist is fully removed, and the other region of the photoresist layer 26 than the m and n regions is a region where the photoresist is fully-remained;

At step S204, a first etching operation is performed to partially remove a portion of the passivation layer 25 corresponding to the n region; for example, after the first etching operation, the portion of the passivation layer 25 corresponding to the n region has a thickness in a range from 1500 angstroms to 2000 angstroms, as shown in FIG. 8;

At step S205, residual or remained photoresist is ashed off and removed from the m region, as shown in FIG. 9;

At step S206, a second etching operation is performed such that the portion of the passivation layer 25 corresponding to the n region is completely removed and that a portion of the passivation layer 25 corresponding to the m region is partially etched; for example, after the second etching operation, portion of the passivation layer 25 corresponding to the m region has a thickness in a range from 4000 angstroms to 4500 angstroms, as shown in FIG. 10.

In an example of the present disclosure, a height difference between a surface of the region or portion of the passivation layer 25 corresponding to the m region and surfaces of other regions or portions of the passivation layer 25 is 3950 angstroms to 4450 angstroms, while in prior arts, a height difference between the surface of the region or portion of the passivation layer corresponding to the m region and surfaces of other regions or portions of the passivation layer is 5950 angstroms. Thus, with the method of manufacturing an array substrate according to the embodiments of the present disclosure, a height difference between surface of a portion of the passivation layer located on an upper surface of the source/drain electrode lead wire and surfaces of portions of the passivation layer located on either side of the source/drain electrode lead wire may be smaller.

Figure 11:
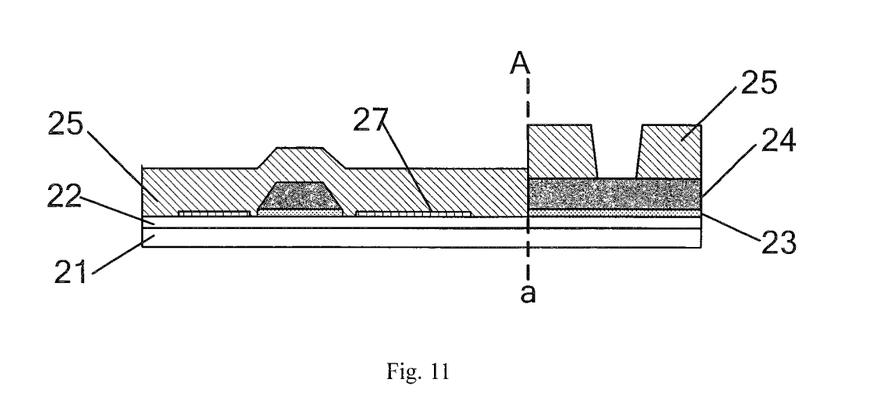
FIG. 11 is a structural schematic diagram showing the array substrate after performing a step S207 of the method shown in FIG. 3 according to an embodiment of the present disclosure.

At step S207, the residual photoresist 26 is stripped off so as to form the array substrate as shown in FIG. 11.

To sum up, in the method of manufacturing an array substrate according to the embodiments of the present disclosure, the active layer, the source/drain electrode lead wire and the passivation layer are firstly formed on the base substrate in turn, then a photoresist layer is formed on the passivation layer, and, by using patterning process including exposure, development and two etching operations, the region or portion of the passivation layer located on the source/drain electrode lead wire is thinned while forming a via hole in the passivation layer, such that a drop or height difference between surfaces of the portions of the passivation layer located on either side of the source/drain electrode lead wire and the surface of the portion of passivation layer located on the upper surface of the source/drain electrode lead wire is reduced, thereby, a rubbing effect at a side of the source/drain electrode layer opposite to a direction of the rubbing action is improved, and the light leakage phenomenon may be avoided without increasing the width of BM for preventing light leakage, increasing the aperture ratio of the display panel.

Figure 12:
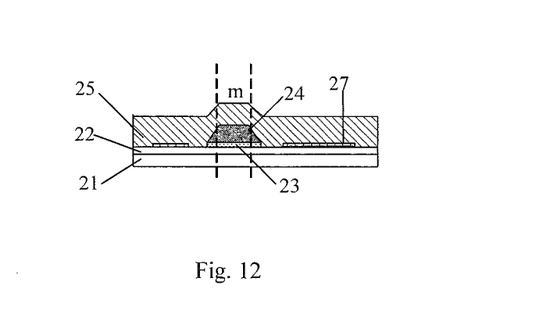
FIG. 12 is a structural schematic diagram showing an array substrate according to an embodiment of the present disclosure, which is manufactured by using the method in embodiments of the present disclosure.

With reference to FIG. 12, embodiments of the present disclosure further provide an array substrate manufactured according to the method provided in the above embodiments of the present disclosure. The array substrate comprises the source/drain electrode lead wire 24 and the passivation layer 25 covering the source/drain electrode lead wire 24, which are formed in turn on the base substrate, a surface of the portion of the passivation layer 25 located in the region (m region) corresponding to the source/drain electrode lead wire 24 is higher than those of other portions of the passivation layer 25, and a thickness of the portion of the passivation layer 25 corresponding to the source/drain electrode lead wire 24 (or located on the source/drain electrode lead wire) is smaller than those of the other portions of the passivation layer 25.

In an example, the array substrate may further comprise the gate insulation layer 22 and the active layer 23 that are formed on the base substrate 21.

Preferably, the thickness of the portion of the passivation layer 25 located in the region (m region) corresponding to the source/drain electrode lead wire 24 is ⅔~¾ of those of the other portions of the passivation layer.

In the embodiments of the present disclosure, in order that the thickness of the region or portion of the passivation layer corresponding to the source/drain electrode lead wire is smaller than those of other regions or portions of the passivation layer, and in order to prevent the surface of the region or portion of the passivation layer corresponding to the source/drain electrode lead wire from being lower than those of the other regions or portions of the passivation layer, the thickness of the region or portion of the passivation layer corresponding to the source/drain electrode lead wire may be preferably reduced to ⅔~¾ of those of the other regions or portions of the passivation layer. The present disclosure, however, is not limited to this.

Embodiments of the present disclosure further provide a display panel, comprising the array substrate provided in the above embodiments of the present disclosure.

In sum, according to the method of manufacturing an array substrate provided in embodiments of the present disclosure, the source/drain electrode lead wire and the passivation layer are firstly formed on the base substrate successively, then performing a patterning process to the passivation layer to form a via hole therein, a portion or region of the passivation layer located on the source/drain electrode lead wire is thinned such that the portion or region of the passivation layer corresponding to the source/drain electrode lead wire is higher than other portions or regions of the passivation layer. Thus, the thickness of the portion or region of the passivation layer corresponding to the source/drain electrode lead wire will be smaller than thicknesses of other portions or regions of the passivation layer, that is, thicknesses of portions of the passivation layer located on either side of the source/drain electrode lead wire may be larger than that of the portion of the passivation layer located on an upper surface of the source/drain electrode lead wire the, such that a drop or height difference between surfaces of the portions of the passivation layer located on either side of the source/drain electrode lead wire and the surface of the portion of passivation layer located on the upper surface of the source/drain electrode lead wire is reduced, thereby, a rubbing effect at a side of the source/drain electrode layer opposite to a direction of the rubbing action is improved, and the light leakage phenomenon may be avoided without increasing the width of BM for preventing light leakage, increasing the aperture ratio of the display panel.

The above described contents are only preferred embodiments of the present disclosure, and are not intended to limit the present disclosure. Various modification and changes may be made to the present disclosure by those skilled in the art. All changes, alternatives or modifications which are made within the principles and spirit of the present disclosure should fall within the scopes of the present invention.

What is claimed is:

1. A method of manufacturing an array substrate, the method comprising steps of:
   forming a source/drain electrode lead wire and a passivation layer in turn on a base substrate, the passivation layer covering at least the source/drain electrode lead wire; and
   thinning a portion of the passivation layer located on a side of the source/drain electrode lead wire facing away from the base substrate such that a surface of the portion is higher than those of other portions of the passivation layer, at the time of patterning the passivation layer to form a via hole therein.

2. The method according to claim 1, wherein the step of thinning the portion of the passivation layer located on the source/drain electrode lead wire comprises:
   forming a photoresist layer on the passivation layer;
   exposing and developing the photoresist layer with a mask so as to form a photoresist partially-remained region, a photoresist fully-removed region and a photoresist fully-remained region, the photoresist partially-remained region corresponding to the source/drain electrode lead wire and the photoresist fully-removed region corresponding to a region of the passivation layer where the via hole is to be formed;
   thinning a portion of the passivation layer corresponding to the photoresist fully-removed region;
   removing photoresist from the photoresist partially-remained region; and
   thinning a portion of the passivation layer corresponding to the photoresist partially-remained region, while fully removing the portion of the passivation layer corresponding to the photoresist fully-removed region to form the via hole.

3. The method according to claim 2, wherein thinning the portion of the passivation layer corresponding to the photoresist fully-removed region comprises:
   etching the portion of the passivation layer corresponding to the photoresist fully-removed region.

4. The method according to claim 3, wherein a thickness of the etched portion of the passivation layer corresponding to the photoresist fully-removed region is ¼~⅓ of those of other portions of the passivation layer.

5. The method according to claim 2, wherein thinning the portion of the passivation layer corresponding to the photoresist partially-remained region comprises:
   etching the portion of the passivation layer corresponding to the photoresist partially-remained region.

6. The method according to claim 2, further comprising:
   stripping off the photoresist from the photoresist fully-remained region.

7. The method according to claim 2, wherein the mask is a half tone mask, a gray tone mask or a mask having slits.

8. The method according to claim 1, wherein a thickness of the thinned portion of the passivation layer located on the source/drain electrode lead wire is smaller than those of the other portions of the passivation layer.

9. The method according to claim 8, wherein a thickness of the thinned portion of the passivation layer located on the source/drain electrode lead wire is 2/3~3/4 of those of the other portions of the passivation layer.

10. The method according to claim 2, wherein a thickness of the thinned portion of the passivation layer located on the source/drain electrode lead wire is smaller than those of the other portions of the passivation layer.

11. The method according to claim 10, wherein a thickness of the thinned portion of the passivation layer located on the source/drain electrode lead wire is 2/3~3/4 of those of the other portions of the passivation layer.

12. An array substrate manufactured by using the method of claim 1, the array substrate comprising the source/drain electrode lead wire and the passivation layer formed in turn on the base substrate,
wherein the passivation layer covers at least the source/drain electrode lead wire, a surface of a portion of the passivation layer located on a side of the source/drain electrode lead wire facing away from the base substrate is higher than those of other portions of the passivation layer, and a thickness of the portion of the passivation layer located on the side of the source/drain electrode lead wire facing away from the base substrate is smaller than those of the other portions of the passivation layer.

13. The array substrate according to claim 12, wherein the thickness of the thinned portion of the passivation layer located on the source/drain electrode lead wire is 2/3~3/4 of those of the other portions of the passivation layer.

14. An array substrate manufactured by using the method of claim 2, the array substrate comprising the source/drain electrode lead wire and the passivation layer formed in turn on the base substrate,
wherein the passivation layer covers at least the source/drain electrode lead wire, a surface of a portion of the passivation layer located on the source/drain electrode lead wire is higher than those of other portions of the passivation layer, and a thickness of the portion of the passivation layer located on the source/drain electrode lead wire is smaller than those of the other portions of the passivation layer.

15. The array substrate according to claim 14, wherein the thickness of the thinned portion of the passivation layer located on the source/drain electrode lead wire is 2/3~3/4 of those of the other portions of the passivation layer.

16. A display panel, comprising the array substrate according to claim 12.

* * * * *